United States Patent [19]
Tou et al.

[11] Patent Number: 5,518,831
[45] Date of Patent: May 21, 1996

[54] ELECTROCATALYTIC STRUCTURE

[75] Inventors: James C. Tou; Ing-Feng Hu, both of Midland, Mich.

[73] Assignee: The Dow Chemical Company, Midland, Mich.

[21] Appl. No.: 499,626

[22] Filed: Jul. 7, 1995

[51] Int. Cl.$^6$ ............................. H01M 8/10; H01M 4/86
[52] U.S. Cl. ............................. 429/42; 429/43; 427/115
[58] Field of Search ........................... 429/12, 30, 33, 429/40, 41, 42, 43, 44, 191, 192; 427/115; 204/410, 421, 290 R, 291; 502/101, 150

[56] References Cited

U.S. PATENT DOCUMENTS

| | | | |
|---|---|---|---|
| 4,039,409 | 8/1977 | LaConti et al. | 204/129 |
| 4,214,958 | 7/1980 | Coker et al. | 204/98 |
| 4,876,115 | 10/1989 | Raistrick | 427/115 |
| 5,084,144 | 1/1992 | Reddy et al. | 205/104 |
| 5,151,515 | 9/1992 | Cisar | 546/12 |
| 5,158,933 | 10/1992 | Holtz et al. | 305/1 |
| 5,171,644 | 12/1992 | Tsou et al. | 429/12 |
| 5,188,923 | 2/1993 | Ahn et al. | 430/273 |
| 5,294,319 | 3/1994 | Kaczur et al. | 204/290 |
| 5,302,269 | 4/1994 | Eisman et al. | 204/252 |

OTHER PUBLICATIONS

A. Hamnett and G. L. Troughton, "Electrocatalysis and the Direct Methanol Fuel Cell", Chemistry & Industry, pp. 480–483, (1992) month not available.

K. Prater, "The Renaissance of the Solid Fuel Cell," Journal of Power Sources, 29, pp. 238–250, (1990) month not available.

H. R. Zeller and D. Kuse, "Optical Properties of Electrically Insulating Granular Metal Films", J. Appl. Phys., vol. 44, No. 6, pp. 2763–2764, (1973) month not available.

M. S. Wilson and S. Gottesfeld, "Thin–Film Catalyst Layers for Polymer Electrolyte Fuel Cell Electrodes", Journal of Applied Electrochemistry, 22, pp. 1–7, (1992) month not available.

E. A. Ticianelli et al., "Localization of Platinum in Low Catalyst Loading Electrodes to Attain High Power Densities in SPE Fuel Cells," J. Electroanal. Chem., 251, pp. 275–295, (1988) month not available.

A. J. Appleby and E. B. Yeager, "Solid Polymer Electrolyte Fuel Cells (SPEFCs)", Energy, The International Journal, vol. 11, Chap. 4, pp. 137–152, (1986) month not available.

*Primary Examiner*—Anthony Skapars

[57] ABSTRACT

An electrocatalytic structure is disclosed which comprises a matrix of a $SiO_xC_yH_z$ having dispersed therein discrete particles of a catalytic material. The method of preparation and use in electrochemical reactions is taught.

7 Claims, 2 Drawing Sheets

ELECTROCATALYTIC STRUCTURE

BACKGROUND OF THE INVENTION

This invention relates to an electrocatalytic structure and a method of preparing such structure. The electrocatalytic structure can be employed in various chemical reactions such as for example to catalyze the electrochemical reactions taking place in fuel cells employing gaseous fuels. In another aspect, the invention concerns fuel cells (especially fuel tells which contain a solid polymer electrolyte) which include the novel electrocatalytic structure as an element thereof.

Electrochemical reactions, such as those carried out in energy conversion devices such as fuel cells containing a solid polymer electrolyte membrane (proton exchange membrane) have been studied extensively since the early 1960's. These fuel cells contain an anode compartment and a cathode compartment separated by the solid polymer electrolyte. Gaseous fuels, such as $H_2$ and methanol, used in these fuel cells require a catalyst to promote the half cell reactions to proceed at useful rates. The catalyst structure should possess several characteristics to be efficient and effective. There should be a low catalyst loading (low weight per active surface area ratio) to reduce the cost of producing electricity. There should be efficient proton and gas access to the catalyst. There should be electronic continuity and low internal electrical resistance. Low susceptibility to carbon monoxide poisoning is important. The catalyst structure must have physical and chemical compatibility with the other components of the cell, e.g., anode and cathode electrodes. The catalyst material should preferably maintain an effective high surface area, e.g., not coalesce, at a temperature up to at least about 140° C. Moreover, the presence of water should not block the gas flow through the structure.

The present invention increases the utility of the catalysts in fuel cells and other electrochemical reactions by improving the effectiveness and efficiency of each of these criteria.

The preparation of composite structures containing a matrix having dispersed therein nanometer sized particles of a material different from the matrix have been prepared and used for different purposes. For example, in U.S. Pat. No. 5,158,933, a phase-separated composite film of two different inorganic materials is disclosed. In that patent, a continuous layer of a first element is prepared by sputter deposition at a first sputtering pressure which is sufficiently low to form a continuous layer (matrix). A layer of discrete particles of a second element is then sputtered onto the first continuous layer under conditions permitting the formation of particles instead of a continuous layer. The layer of discrete particles is then coated with a second continuous layer (matrix) of the first element by adjusting the conditions of sputtering to those used in the first step. A plurality of alternating layers of particles and continuous phases can be built up by repeating the process steps. The process is used to prepare composite structures of, for example, discrete particles of molybdenum dispersed in a continuous aluminum matrix. The composites are used for various electronic, magnetic and glass ceramic applications such as high temperature coatings and the like. The process of this patent is particularly useful for making structures containing two different elements which are normally miscible under conditions of concurrent sputtering.

The Journal of Applied Phys., Vol. 44, No. 6, June 1973, contains an article entitled "*Optical Properties of Electrically Insulating Granular Metal Films*" by H. R. Zeller and D. Kuse at pages 2763 and 2764, which describes a structure composed of metal particles and an inorganic dielectric. The structure is prepared by successive evaporation of metal, e.g., tin, and an insulator, e.g., $MgF_2$ to form a structure containing islands (particles of tin) and a layer of an insulator, e.g. $MgF_2$. The small metal particles are insulated from each other.

In another field, an optical information storage media is prepared by vacuum depositing (e.g., sputtering) a discontinuous film of nucleated metallic islands (particles) onto a substrate. The islands have a thickness of less than about 100 Angstroms (10 nanometers) and a diameter measured parallel to the surface of the substrate of less than about 1000 Angstroms (100 nanometers). The particles are then coated with a transparent dielectric material such as a polymer using, for example, glow discharge techniques.

Another technique, used to prepare colored polymeric coatings, is taught by H. A. Beale, "*Plasma Polymerization Produces Colored Polymeric Coatings*", Industrial Research and Development, July 1981, Page 135–139. Plasma polymerization of a suitable monomer is carried out with evaporation of a metal to provide a metal particle loaded film.

Many electrochemical reactions and systems are disclosed which utilize a catalyst in the system. For example, see U.S. Pat. Nos. 4,039,409; 5,084,144; 4,876,115; 5,302,269 and 5,151,515. Several publications describe work with catalyst systems for use in solid polymer electrolyte fuel cells. For example, see page 137–152 of Energy, Special Issue, "*Assessment of Research Needs For Advanced Fuel Cells*", Pergamon Press, Editor, S. S. Penner, ISBN 0-08-033990-5 (1986); J. Electroanal. Chem. 251 (1988), page 275–295, "*Localization of Platinum In Low Catalyst Loading Electrodes to Attain High Power Densities in SPE Fuel Cells*", Edson A. Tieianelli, Charles R. Deronium and Supramaniama Srinivasan, Los Alamos National Laboratory (1988); Journal of Applied Electrochemistry, vol. 22, p. 127, (1992), "*Thin Film Catalyst Layers for polymer Electrolyte Fuel Cell Electrodes*", M. S. Wilson and S. Gottesfeld. The electrocatalytic structures of the invention have superior properties over those taught in this last publication.

SUMMARY OF THE INVENTION

The electrocatalytic structure of the present invention comprises a matrix formed of a thin film of $SiO_xC_yH_z$ polymer having dispersed therein non-supported discrete particles of a catalytic material. The discrete catalyst particles have an average diameter suitable for the intended use of the structure. For example, for fuel cell use they have an average diameter in the vertical direction (based on Transmission Electron Microscopic Analysis (TEM)) of less than about 10 nm. The particles are not generally spherical in shape and the size is based on area measurements which are then converted to generally spherical shapes for purpose of measurement definition.

Non-supported means the discrete catalyst particles are not retained on the surface of second separate particles, such as particulate carbon, but are dispersed in the matrix without such support. Mixtures of two or more catalytic materials formed as a mixture or one deposited on the surface of another are not considered supported as used herein.

The matrix should be deposited to provide a polymer coating over the discrete particle having a thickness of at a maximum up to about 2 nm.

A method for forming the electrocatalytic structure comprises using a plasma enhanced chemical vapor deposition method (PECVD) to initiate the polymerization reaction of a reactive organosilicone compound in the presence of a substrate having a suitable surface for the polymerization products of the plasma process to form a thin film (less than about 10 nm thickness) on the substrate surface employing a power density ranging from $10^6$ to $10^8$ Joules (J)/Kilogram (Kg). A catalyst material is then vacuum deposited onto the substrate as small discrete particles or islands. The sequence of film forming and particulate catalyst deposition is repeated until an electrocatalytic structure having the desired thickness and catalyst loading is achieved. If desired, the discrete catalyst particles can be first deposited onto a substrate followed by the plasma polymerization of the film matrix over the deposited particles and then repeated as many times as desired.

Power density, as used herein, is the value of W/FM wherein W is an input power applied for plasma generation expressed in J/sec, F is the flow rate of the organosilicone compound gas expressed in moles/sec and M is the molecular weight of the reactant in Kg/mole. For a mixture of gases the power density can be calculated from $W/\Sigma F_i M_i$ wherein "i" indicates the "i"th gaseous component in the mixture. It has been discovered that by practicing within the power density range, a thin film of the $SiO_xC_yH_z$ polymer can be formed on the substrate surface and over discrete particles of the catalysts material.

As indicated, the discrete particulate catalyst material is vacuum deposited, e.g., sputtered, evaporated, etc. onto a substrate, in a controlled manner to provide a layer of discrete particles (islands) thereof. A layer of the plasma polymerized organosilicone polymer film can be used as the initial surface if the plasma polymerized organosilicone polymer film is laid down first and then the particles. A second film of the organosilicone polymer is then formed over the particles. The substrate can be removed from the so formed catalytic structure and the catalytic structure used as a catalyst in an electrochemical reaction, such as in fuel cells. The substrate can also form a part of the structure such as an anode or cathode electrode, or the solid polymer electrolyte in a fuel cell, and thus the electrocatalytic structure does not need to be removed therefrom.

The polymer matrix is generally referred to herein as $SiO_xC_yH_z$. The exact chemical formula is not known, but should be limited to that which will not adversely affect the catalytic function of the structure. It is known, for example, that excess oxygen in the initial plasma polymerization reaction can cause the formation of a matrix which adversely affects the catalyst function of the structure.

The invention also includes the use of the electrocatalytic structure in an electrode structure to be used in a fuel cell. The electrocatalytic structure for example is sandwiched at least between an electroconductive backing layer and a solid polymer electrolyte for forming an electrode. Preferably the electrocatalytic structure is used in a gas reaction fuel cell. For example, the electrocatalytic structure may be prepared by first forming the $SiO_xC_yH_z$ polymer film onto a gas diffuser which can also function as a current collector, such as carbon fiber paper; depositing the discrete catalyst particles, and then forming at least one more thin coat of the $SiO_xC_yH_z$ polymer over the particles. The reverse procedure also can be used, i.e., depositing the metal particles first, followed by the $SiO_xC_yH_z$ film. The two deposition phases can be practiced alternatively as many times as necessary to build up an electrocatalytic structure having the desired catalyst loading and thickness.

Another embodiment of the invention comprises an electrolytic cell having an anode and catalytic particles in an anode compartment and a cathode and catalytic particles in a cathode compartment wherein the source of the catalytic particles is a thin film composed of $SiO_xC_yH_z$ matrix having dispersed therein a catalytic quantity of non-supported catalytic particles.

In still another embodiment an improved fuel cell for generating electricity from a reaction between a fuel source and an oxidant source is provided. The fuel cell contains a first porous gas diffusion electrode, a second porous gas diffusion electrode, the second electrode defining an electric field with the first electrode, an electrocatalytic material in contact with said first electrode, an electrocatalytic material in contact with the second electrode and an electrolyte disposed between the first and second electrodes which is in electronic contact with both catalyst materials. The cell contains as the catalyst material a thin film of $SiO_xC_yH_z$ matrix having dispersed therein discrete particles of a catalytic material.

DETAILED DESCRIPTION OF THE INVENTION

An electrocatalytic structure of the present invention can be prepared employing any known type of vacuum plasma polymerization and sputtering or evaporation equipment. Capacitive coupling modes or inductive coupling modes can be used to introduce energy into the chemical system. Sequential vacuum depositing of the discrete catalyst particles is employed. The sequential technique can be repeated as many times as necessary to provide an electrocatalytic structure of desired thickness and catalyst loading. Either one or both of the sequential steps can include magnetic confinement.

Figure 1:
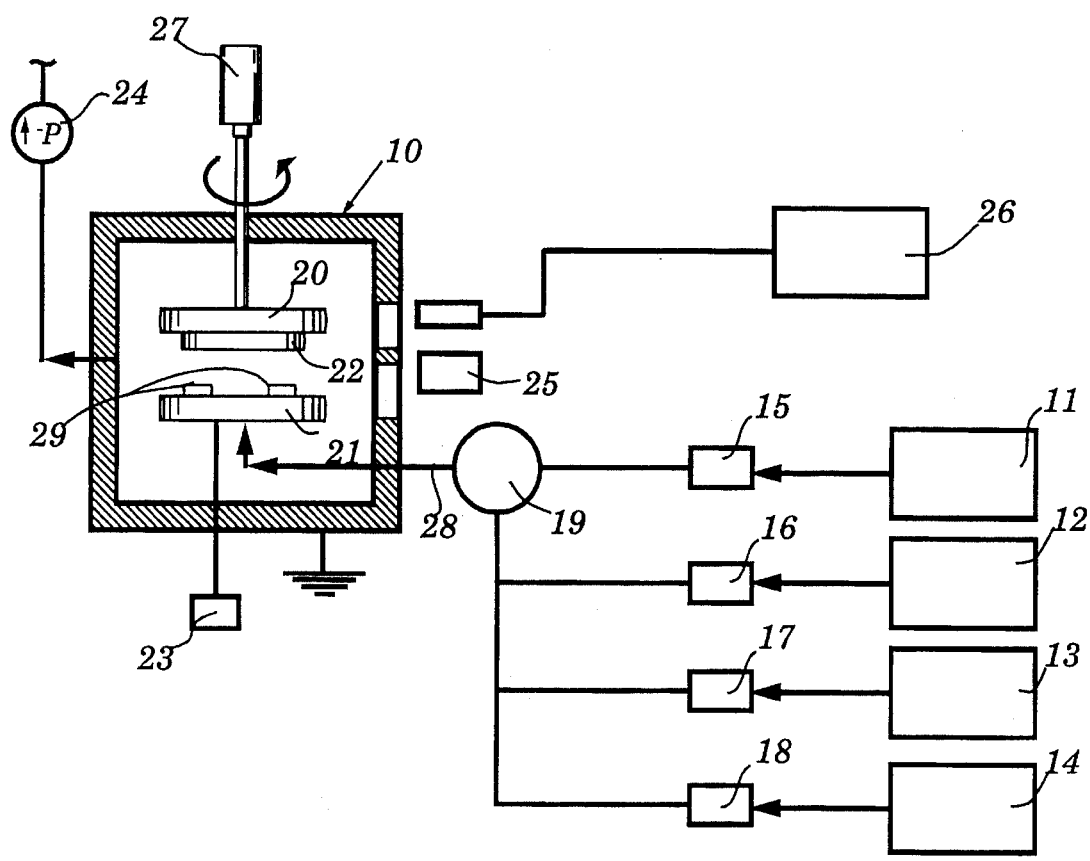
FIG. 1 is a schematic view of a plasma polymerizing and metal vacuum sputtering apparatus which was used in the examples. Other types of plasma polymerizing apparatus can be used to practice the invention.

FIG. 1 illustrates an apparatus in which an electrocatalytic structure of the invention can be formed on the surface of a suitable substrate from which the structure can be removed or the substrate can be used as part of the structure. The apparatus uses a variable frequency power source. The apparatus comprises a reactor vessel 10 into which the organosilicone monomer and other gaseous reactants, if any, are introduced from a organosilicone monomer source 11 and an optional second reaction gas sources 13 and 14, e.g., oxygen, nitrogen, etc., and optionally an inert gas through mass flow controllers 15, 16, 17 and 18. If desired the different gases and vapors from the indicated sources can be mixed in a mixer 19 prior to introducing them into the reactor vessel.

Positioned in the reactor vessel 10 are a pair of opposed electrodes 20 and 21. One electrode 20, the anode, is a rotary support electrode on which a substrate 22 is affixed. The substrate 22 on which the electrocatalytic structure is formed is placed between the electrodes 20 and 21. Electrode 21, the cathode, is connected to a variable frequency power source 23 and the rotary support electrode 20 is grounded through the reactor vessel walls. Optionally the electrode 20 can float. Electrode 21 is of the shower head type through which the gaseous reactants are dispersed into the interior of the vessel from gas supply line 28. The electrode 21 is preferably of a magnetic confined type as shown for example in U.S. Pat. No. 5,298,587, the disclosure of which is herein incorporated by reference. In one embodiment targets of catalyst material 29 are placed on the cathode 21. The targets can be placed in other areas of the reactor vessel 10, if desired. For example a single sheet of catalytic material can be placed on the surface of the cathode shown in FIG. 2 of U.S. Pat. No. 5,298,587.

Although the support electrode 20 is shown at the top and electrode 21 is shown at the bottom of the reactor vessel, these can be reversed or positioned at different locations. Likewise, although the substrate 22 is shown attached to electrode 20 it could comprise a webb or bed and be moved along the electrode, if desired.

The reactor vessel 10 is connected to a vacuum system 24 for evacuating the vessel. Optionally the reactor vessel can be equipped with monitoring devices such as an optical monitor 25 to determine the thickness of the matrix coating and/or a spectrometer 26 to continuously monitor the reactive species formed in the plasma. The rotary support electrode 20 is rotated by a motor 27, located, in this embodiment, outside of the vessel 10.

In operation the reactor vessel 10 is first evacuated by means of the vacuum pump 24 prior to introducing the gaseous reactants i.e., organosilicone, and inert gases, if any, to the vessel at a predetermined flow rate through supply line 28. When the flow rate of the gases becomes constant the variable frequency power 23 is turned on and set to a predetermined value to generate a plasma. The plasma causes the gaseous reactants to polymerize and form polymerized silicone film on the substrate 22. The power supplied to the system during this phase is insufficient to cause evaporation of the catalyst material from the targets 29. Following the deposition of the matrix to a selected thickness, the flow of reactive gases is stopped. Next an inert gas, such as argon, for sputtering is introduced and the power is then increased sufficiently to cause the sputtering of the catalyst material onto the preformed matrix material. The process of depositing the silicone polymer is then repeated to cover the particles with the polymerized silicone film.

Figure 2:
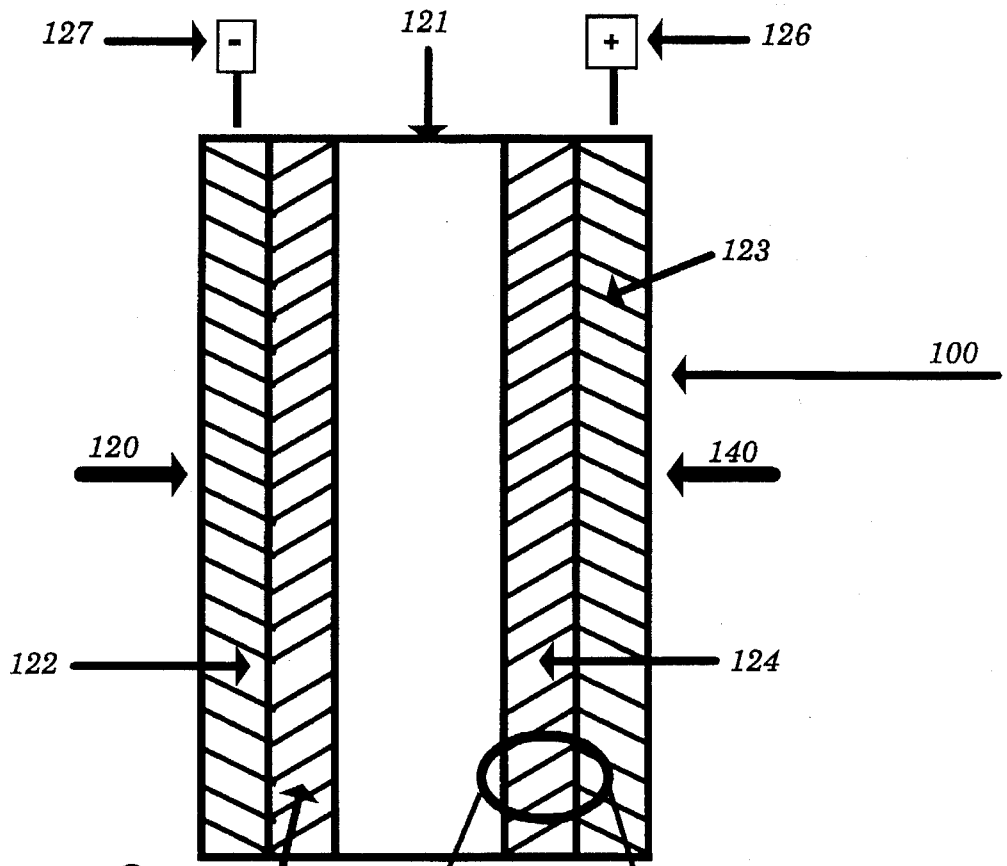
FIG. 2 is a cross section of a fuel cell containing an electrolytic structure in accordance with one embodiment of the invention. Other fuel cell structures and electrochemical reaction cells can be made containing the electrocatalytic structure of the invention.
Figure 2A:
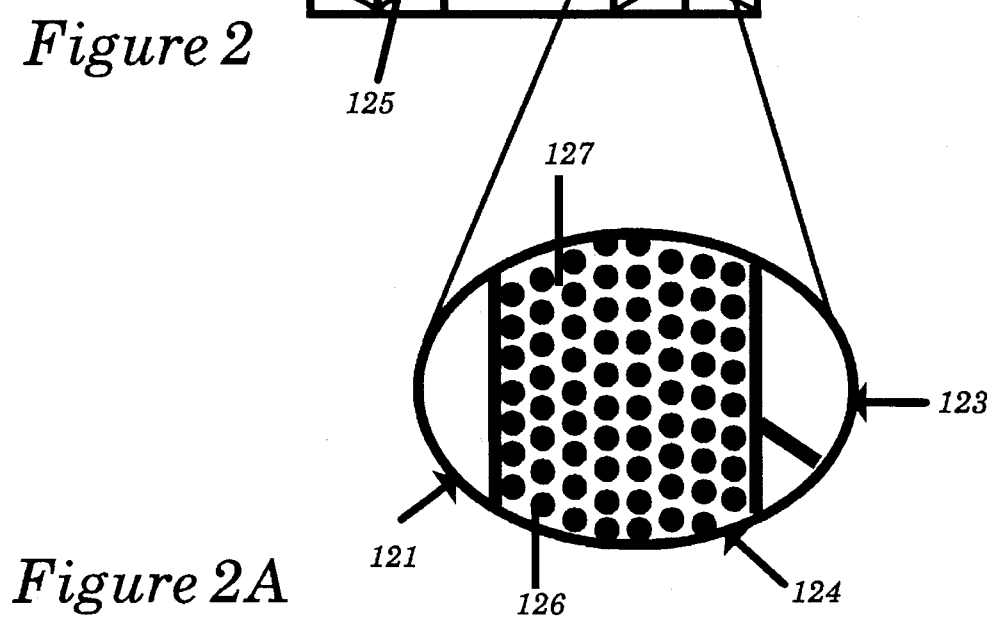
FIG. 2A is a magnified view of the electrocatalytic structure of the embodiment shown in FIG. 2.

FIG. 2 and 2A illustrate in general detail the configuration of one stack of a fuel cell 100. The fuel cell stack 100 utilizes a gas fuel source 120, gas oxidizer source 140, and a solid polymer electrolyte (SPE) membrane 121. The membrane 121 is contained between porous anode backing structure 122 and porous cathode backing 123 and at least one electrocatalytic structure of this invention 124 that is adhered to the cathode surface of SPE membrane 121. Electrocatalytic structure 125 may also be disposed between the SPE membrane 121 and anode backing structure 122. Cathode backing 123 is electrically connected to cathode 126 and anode backing 122 is electrically connected to anode 127. In FIG. 2A the electrocatalytic structure 125 is composed of catalyst particles 126 and matrix 127.

The following general procedures of using PECVD and vacuum deposition (sputtering, evaporation, etc.) for polymerizing the $SiO_xC_yH_z$ film and forming the discrete particulate catalyst materials can be used. When an electric discharge is produced at low pressure in the gaseous reactants the reactants become ionized, forming a plasma. A portion of the material is in the form of reactive species such as ions, electrons, and free radicals generated in the plasma prior to formation of the film on the substrate. Most of the reactive species consist of free radicals. It is thought that most of the film formation on the substrate occurs when the reactive species diffuse out of the plasma to the surface of the substrate. The reactive species react on a suitably prepared substrate surface to form the desired film.

In producing the $SiO_xC_yH_z$ matrix polymer film by PECVD, the substrate, e.g., a carbon felt electron collector, is placed in a reactor chamber in which an electric field can be generated. The reactor chamber must be capable of being substantially evacuated, i.e., to a pressure within the range of about $10^{-3}$ to about 1 Torr (about $1.3 \times 10^{-3}$ millibar to about 1.3 millibar), preferably about $10^{-2}$ to about $10^{-1}$ Torr (about $1.3 \times 10^{-2}$ millibar to about 0.13 millibar).

The method of generating and applying the electric field is not critical to this process. For example, the electric field may be generated by inductive coupling methods, as described, for example, by J. Vossen in "Glow Discharge Phenomena in Plasma Etching and Plasma Deposition", J. Electrochemical Society, February 1979, pp. 319–324, the teachings of which are incorporated herein by reference.

A capacitively coupled system is preferably used to generate an electric field. In this system, two electrodes are situated within the reactor chamber, and a plasma is formed between the electrodes. Each electrode may be made in the form of a plate made from a material that is a good electrical conductor, e.g., aluminum or a nonconductor material in combination with electroconductive material. The electrodes preferably each have a planar face parallel to the other electrode.

In one embodiment of the invention where a capacitively coupled system is utilized, the electrodes are horizontally arranged, i.e., an upper electrode is affixed in the upper region of the reactor vessel with a planar surface facing a planar surface of a lower electrode affixed in the lower region of the vacuum chamber. The spacing between the electrodes depends on the desired strength of the applied electric field, as well as the size, shape and chemical composition of the substrate on which the electrocatalytic structure is formed. Those skilled in the vapor deposition art appreciate the interrelationship of these processing variables and are therefore able to make adjustments for a particular use of this invention without undue experimentation. In this embodiment, the substrate is positioned on the surface of the upper electrode which faces the lower electrode such that the substrate surface upon which the electrocatalytic structure is formed is parallel to the facing surface of the lower electrode. The lower electrode is preferably a shower head type providing a magnetic field which concentrates the plasma between the electrodes. A substantial portion of the gaseous reactants should be made to flow through the magnetic field and the plasma.

The film-forming materials must be in gaseous form for the PECVD process. Gaseous reactants, such as organosilicone monomers, are vaporized from the liquid form prior to entry into the reactor vessel. A preferred technique when sufficient vapor pressures are difficult to obtain is to evaporate the nonvolatile reactant inside of the reaction chamber. The liquid material may be degassed by cooling it and then subjecting it to a vacuum. Depending on its particular boiling point, the liquid is then heated to ambient temperature or higher in order to provide sufficient positive vapor pressure to flow through a channeling system to the reactor vessel. Alternatively, an inert carrier gas such as helium can be blown through the liquid to prepare a diluted vapor mixture of desired composition.

The gaseous reactants may be supplied from an external source through a series of inlet pipes into the reactor vessel. The technical particularities of channeling the various gases into the reactor chamber are well known in the art and need not be described in detail here. For example, each gas conduit may be connected to a central feed line which carries the gases into the reactor vessel. In a preferred embodiment the gaseous reactants are mixed with a carrier gas such as argon to improve the flow of the reactants into the vessel. The flow of carrier and reactant gases into the reactor may be governed by mass flow controller valves which are well known in the art and which serve to both measure and control the flow of gases. Furthermore, the carrier gas, when used, may be premixed with the gaseous reactants or may be fed into the central feed line by a separate inlet. Although a carrier gas is not critical to the present invention, its use improves the uniformity of plasma density and gas pressure within the reactor vessel. Furthermore, use of the carrier gas tends to prevent gas phase particulation of the plasma-formed polymer and also improves film quality in terms of its electrical properties.

When using the capacitively coupled method, the gaseous reactants entering the reactor vessel from the central feed valve are passed between the upper and lower electrodes and under the substrate upon which the electrocatalytic structure is to be formed. The quality of the matrix film on the substrate depends greatly on both the flow rate of the reactants and the flow dynamics. For example, excessive flow rates would force the gaseous reactants past the deposition surface before they react to form the matrix film. Conversely, if the flow rate is too slow, the reactants will quickly be depleted and thereby lead to irregularities in film thickness. A shower head cathode which disperses the gaseous reactants in a line essentially perpendicular to the surface substrate, i.e., in a line which is perpendicular to the second electrode and not longitudinal thereto has been found to provide quality matrix films. The flow rate of reactants may range from about 2 sccm to about 250 sccm, with about 2 sccm to about 100 sccm being preferred in the reactor used in Examples 1–6. For coating surfaces larger than about 10 square feet, a larger reactor vessel would be required and higher flow rates may be desirable, e.g., up to about 2000 sccm or more with appropriate pumping systems.

Preferably total gas flow into the reactor vessel should be constant during the deposition of the matrix polymer. This should not be viewed as an absolute requirement to prepare good quality $SiO_xC_yH_z$ polymer, but as a more efficient means for process control.

The flow of the gaseous reactants relative to the substrate surface is important because it enhances the uniformity of the $SiO_xC_yH_z$ polymer in terms of thickness and properties such as hardness, adhesion and thermal expansion compensation capabilities.

A suitable catalyst target material is also provided in the reactor vessel. Any suitable vacuum deposition technique such as ion bombardment, sputter etching or arc sputtering can be used to transfer the catalyst from the target to the substrate in the form of discrete particles. The catalyst material is deposited as discrete islands (particles) onto the substrate. Alternatively, evaporation technology well known in the art such as electron beam heating or resistant heating, can be used to deposit the particulate catalyst material onto the substrate.

The substrate surface should be clean (free from contamination). It can be cleaned by washing with an alcohol solvent such as isopropanol, methanol, etc. prior to application of the polymer/catalyst layer. This step removes dirt, contaminants, and additives such as wetting agents from the surface.

The substrate may be vacuum desiccated by well-known methods to remove any water on or in the surface region which would interfere with the adhesion of the subsequently-deposited film. Temperatures ranging from about ambient temperature to about 120° C., with the preferred range being about 80° C. to about 90° C. can be used. From about 2 hours to about 16 hours, with longer times within this range compensating for lower temperatures, and vice versa are usually required.

If desired, the surface of the substrate can be etched after being placed in the reaction vessel. Etching techniques, which in general are well-known in the art, may also be used to create free radical species thereon which will later bond with the free radical species of the plasma-applied material, thereby improving adhesion between these layers. Surface activation techniques such as reactive or nonreactive plasma treatments, ion beam sputtering and the like can be employed. This method is preferred when the substrate is to become a part of the electrocatalytic structure.

As the gaseous reactants enter the reactor vessel, an electric field is generated under preselected frequency and power conditions to ionize the gas mix, thereby forming a plasma. Methods of generating an electric field between electrodes are well-known in the art and therefore do not require an exhaustive description here. An electric field, from D.C. to about 10 GHz may be used. For example, D.C. voltage, alternating current (A.C. frequency) and microwave frequency can be used.

A particularly suitable electrical field-generating means for this process is the use of a high frequency power supply to initiate and sustain the plasma. When such a power supply is used, a preferred operating frequency is 40 KHz. The particular frequency and power values utilized will depend in part on the particular deposition requirement for the matrix material. For example, when organosilicone monomers are reacting in the plasma, lower frequencies and higher electrical power values within the above-described ranges increase the deposition rate of the material, especially under the conditions of lower chamber pressures at a fixed flow rate.

As previously mentioned, however, all these parameters are adjusted to provide a power density within the described range during formation of the matrix material.

An additional refinement, well known in the art, which offers the potential for beneficially modifying the plasma (e.g., by increasing the ionization and providing improved spatial control of the plasma), uses separate magnetic fields in conjunction with the electric field. An example of such magnetic enhancement is "ECR" (electron cyclotron resonance) microwave plasma technique.

After passing over the substrate surface, the carrier gas and any gaseous reactants or products which have not been deposited on the substrate surface may be directed out of the vessel through an exit valve and then to a gas pumping and exhaust system. Means for expelling these excess materials from the vessel are well known in the art. In FIG. 1 a general pumping system 24 is shown.

Organosilicone compounds useful in this invention are organic compounds in which at least one silicon atom is bonded to at least one carbon atom and includes for example silanes, siloxanes and silazanes. These organosilicone compounds may be used individually or in combinations of 2 or more. Examples of silanes include dimethoxydimethylsilane, methyltrimethoxysilane, tetramethoxysilane, ethyltrimethoxysilane, diethoxydimethylsilane, methyltriethoxysilane, octamethylcyclotetrasilane, triethoxyvinylsilane, tetraethoxysilane, dimethoxymethylphenylsilane, phenyltrimethoxysilane, 3-glycidoxy-propyltrimethoxysilane, 3-methacryloxypropyltrimthoxysilane, diethoxymethylphenylsilane, tris(2-methoxyethoxy)vinylsilane, phenyltriethoxysilane, and dimethoxydiphenylsilane.

Examples of siloxanes include tetramethyldisiloxane and hexamethyldisiloxane.

Examples of silazanes include hexamethylsilazane and tetramethylsilazane.

In the practice of the invention, it is preferred that the PECVD process be carried out employing a power density ranging from about $10^6$ to $10^8$ J/Kg during the formation of the matrix polymer. Higher power densities produce films which easily crack while lower densities produce films which are unsuitable. The power density comprises the sum of the individual power consumed by the gases involved in the reaction e.g., organosilicone monomer and, if used, oxygen and an inert gas. Higher power is then used to form the discrete particulate catalyst material.

The substrate temperature is not critical and can range from ambient up to the glass transition temperature of the plastic of the substrate.

The flow rate of the polymerization gas is primarily dependent on the equipment employed to carry out the reaction and is directly related to the required power density.

The organosilicone film may be post treated with an oxygen or organosilicone plasma to render the surface of the coating more hydrophilic or hydrophobic, respectively.

The electrocatalyst material can comprise any metal or mixture or alloy thereof or oxide which demonstrates catalytic activity in the particular electrochemical reaction in which the electrocatalytic structure is to be used. Included for example are platinum, silver, gold, other precious metals and metal oxides such as the platinum group oxides such as, oxides prepared from ruthenium, rhodium, palladium, iridium and osmium and mixtures and alloys thereof. For $H_2/O_2$ fuel cell reactions, platinum is preferred. For methanol/$O_2$ fuel cells platinum and ruthenium are preferred.

The following examples are included for illustrative purposes.

The process of generating plasma polymerized nanoparticle composite was carried out in a PECVD stainless steel box coater with a shower head planar magnetron cathode. The general configuration of the coater is described in FIG. 1. The cathode is described in U.S. Pat. No. 5,298,587 in FIGS. 2 and 3 and the text describing the Figures. The following examples of the invention were conducted following the general procedure described next. The substrate (22) was placed 1¼" (3.2 centimeters) above the cathode which was placed on the anode 20. A sputtering target (e.g., platinum, silver or palladium (3.5 in×3 in×1/16 in thick, 8.9 cm by 7.6 cm by 0.16 cm) was placed directly on the cathode. Nanoparticles were deposited on a substrate by first sputtering the target material with 20 sccm Ar at the power level of 200 W for a period of time, which is usually in seconds depending on the desired particle size. The particles were then covered with a polymer film generated by plasma such as plasma polymerized tetramethyldisiloxane. During the period of plasma polymerization, no argon gas was introduced. The above sputtering and plasma polymerization was repeated sequentially to generate one layer of nanoparticles encapsulated by one layer of plasma polymerized polymer and then repeated. The thickness is dependent on the number of the repetitions of the sequence described above.

EXAMPLE 1

A composite structure containing 50 layers, (a loading of 0.01 mg/cm²/layer of Pt nanoparticle in each layer) and plasma polymerized tetramethyldisiloxane (TMDSO) was prepared on a substrate comprising E-TEK Company (Naatick, Mass.) graphite paper (4.0 mg/cm² carbon only loaded 0.35 mm thick graphite weave cloth).

The composite was prepared with 50 repetition of Pt sputtering and plasma polymerization of tetramethyldisiloxane. The Pt was sputtered at 200 W with 20 sccm Ar for 20 seconds for each repetition. The tetramethyldisiloxane was polymerized at 10 W with 4.7 sccm tetramethyldisiloxane for 6 seconds for each repetition. There was a 20 second resting period between the sputtering and the plasma polymerization during which allowed the gas flow to reach steady state. During the resting period, the plasma power was turned off. The graphite paper substrate (3 cm×3 cm) was placed on the anode 1¼" (3.2 cm) above the cathode. The resulting composite was analyzed and found to contain discrete particles of Pt. The catalyst loading was 0.5 mg/cm².

EXAMPLE 2

Another composite structure was prepared as in Example 1 except that it contained only 25 layers. The catalyst loading was 0.25 mg/cm².

EXAMPLE 3

A 10 layer composite was prepared as described in Example 1. The catalyst loading was 0.1 mg/cm².

EXAMPLE 4

A 25 layer composite was prepared as in Example 1 except that the sputtering time for each repetition was increased to 40 seconds. Analysis of this structure showed an average particle size of about 4.5±1.6 nm. The catalyst loading was 0.58 mg/cm².

EXAMPLE 5

The sample was prepared with the same conditions as 25 layer sample described above in Example 2 except that the sputtering time for each repetition is 8 seconds. The TMDSO polymerization time was maintained at 6 seconds. The catalyst loading was 0.1 mg/cm².

EXAMPLE 6

A 5 layer Ag nanoparticle-plasma polymerized TMDSO composite was prepared using Scotch brand adhesive tape as a substrate. The sample was prepared using 5 repetitions of 20 sccm Ar, 200 W, 40 sec Ag sputtering, 20 second resting period, and 4.7 sccm TMDSO, 10 W, 6 second plasma polymerization. The particle size prepared using these conditions was about 100 A0 (10 nm) determined using a TEM examination. The particle size distribution was not analyzed.

EXAMPLE 7

The use of the composites of Examples 1–5 as catalysts was tested in a testing fuel cell. Two layers of the composite were hot pressed (one to each side) onto a perfluorosulfonic acid membrane (The Dow Chemical Company, Dow PFSA 800, (equivalent molecular weight of 830) as the solid polymer electrolyte (3.5 inch×3.5 inch [8.9 cm× 8.9 cm]). The hot pressing was done by first preheating the laminate in a hot presser for 5 minutes at 380° F. (193° C.) while under a pressure of 163 psi (1.1×10$^5$K/m$^2$) and then at 816 psi (5.7×10$^5$K/m$^2$) also at 380° F. (193° C.). The so prepared hot pressed structure was then placed in a 10 square centimeter test cell in a fuel cell test station (Fuel Cell Technologies, Inc., Sante Fe, N. Mex.). This test station included computer software connected to a personal computer process control unit to run and collect the data reported in Tables I–V. The fuel cell was used to generate electricity and to generate the polarization state set forth in the following Tables I–V. The fuel cell evaluation was carried out at cell temperature 80° C., anode humidifier temperature of 70° C., cathode humidifier temperature of 60° C. The hydrogen flow was 150 sccm and the air flow was 1000 sccm. No flow restriction was applied at the outlets of cathode and anode compartment (i.e., the cell pressure was zero in addition to the pressure which might be created due to the gas flow and cell flow resistance). The data obtained from testing each of the composites of Examples 1–5 are reported in the following Tables I–V. It is evident from this data that the electrocatalytic structures functioned well as catalysts in the fuel cell environment.

TABLE I

| Total Current (Amp) | Current Density (Amp/cm2) | Voltage (V) |
| --- | --- | --- |
| 0.0 | 0 | 0.987 |
| 0.057 | 0.006333333 | 0.954 |
| 0.493 | 0.054777778 | 0.904 |
| 1.08 | 0.12 | 0.855 |
| 1.901 | 0.211222222 | 0.805 |
| 2.907 | 0.323 | 0.755 |
| 4.114 | 0.457111111 | 0.705 |
| 5.439 | 0.604333333 | 0.655 |
| 6.813 | 0.757 | 0.606 |
| 8.021 | 0.891222222 | 0.556 |
| 9.026 | 1.002888889 | 0.506 |
| 10.133 | 1.125888889 | 0.44 |
| 10.669 | 1.185444444 | 0.39 |
| 10.954 | 1.217111111 | 0.357 |
| 11.089 | 1.232111111 | 0.307 |
| 11.189 | 1.243222222 | 0.257 |
| 11.29 | 1.254444444 | 0.207 |
| 11.122 | 1.235777778 | 0.207 |
| 10.703 | 1.189222222 | 0.257 |
| 10.2 | 1.133333333 | 0.307 |
| 9.63 | 1.07 | 0.357 |
| 9.043 | 1.004777778 | 0.39 |
| 8.406 | 0.934 | 0.44 |
| 7.568 | 0.840888889 | 0.506 |
| 6.797 | 0.755222222 | 0.556 |
| 5.942 | 0.660222222 | 0.606 |
| 4.969 | 0.552111111 | 0.655 |
| 3.963 | 0.440333333 | 0.705 |
| 2.924 | 0.324888889 | 0.755 |
| 1.985 | 0.220555556 | 0.805 |
| 1.18 | 0.131111111 | 0.855 |
| 0.56 | 0.062222222 | 0.904 |
| 0.09 | 0.01 | 0.954 |
| 0.0 | 0 | 0.987 |
| Load Cell Area | [9 cm^2] | |
| Anode Pressure | [0] | |
| Anode Temperature | [70 C.] | |
| Anode Gas Flow Rate | [150 ml/min] | |
| Cathode Pressure | [0 psig] | |
| Cathode Temperature | [60 C.] | |
| Cathode Gas Flow Rate | [1000 ml/min] | |
| Initial Voltage | [1 Volts] | |
| Voltage Increment | [.05 Volts] | |
| Delay Between readings | [5 sec] | |
| Anode Gas | [HYDROGEN] | |

TABLE I-continued

| Total Current (Amp) | Current Density (Amp/cm2) | Voltage (V) |
| --- | --- | --- |
| Cathode Gas | [Air] | |

TABLE II

| Total Current (Amp) | Current Density (Amp/cm2) | Voltage (V) |
| --- | --- | --- |
| 0 | 0 | 1.004 |
| 0.023 | 0.002556 | 0.954 |
| 0.342 | 0.038 | 0.904 |
| 0.912 | 0.101333 | 0.855 |
| 1.7 | 0.188889 | 0.805 |
| 2.706 | 0.300667 | 0.755 |
| 4.064 | 0.451556 | 0.705 |
| 5.539 | 0.615444 | 0.655 |
| 7.115 | 0.790556 | 0.606 |
| 8.523 | 0.947 | 0.556 |
| 9.647 | 1.071889 | 0.506 |
| 10.837 | 1.204111 | 0.44 |
| 11.457 | 1.273 | 0.406 |
| 11.944 | 1.327111 | 0.357 |
| 12.346 | 1.371778 | 0.307 |
| 12.681 | 1.409 | 0.257 |
| 13 | 1.444444 | 0.207 |
| 12.882 | 1.431333 | 0.207 |
| 12.279 | 1.364333 | 0.257 |
| 11.608 | 1.289778 | 0.307 |
| 10.938 | 1.215333 | 0.357 |
| 10.217 | 1.135222 | 0.39 |
| 9.513 | 1.057 | 0.44 |
| 8.507 | 0.945222 | 0.506 |
| 7.635 | 0.848333 | 0.556 |
| 6.646 | 0.738444 | 0.606 |
| 5.489 | 0.609889 | 0.655 |
| 4.315 | 0.479444 | 0.705 |
| 3.159 | 0.351 | 0.755 |
| 2.086 | 0.231778 | 0.805 |
| 1.13 | 0.125556 | 0.855 |
| 0.426 | 0.047333 | 0.904 |
| 0.04 | 0.004444 | 0.971 |
| 0 | 0 | 1.004 |
| Load Cell Area | [9 cm^2] | |
| Anode Pressure | [0] | |
| Anode Temperature | [70 C.] | |
| Anode Gas Flow Rate | [150 ml/min] | |
| Cathode Pressure | [0 psig] | |
| Cathode Temperature | [60 C.] | |
| Cathode Gas Flow Rate | [1000 ml/min] | |
| Initial Voltage | [1 Volts] | |
| Voltage Increment | [.05 Volts] | |
| Delay Between readings | [10 sec] | |
| Anode Gas | [HYDROGEN] | |
| Cathode Gas | [Air] | |

TABLE III

| Total Current (Amp) | Current Density (Amp/cm2) | Voltage (V) |
| --- | --- | --- |
| 0 | 0 | 0.938 |
| 0.023 | 0.002555556 | 0.904 |
| 0.225 | 0.025 | 0.855 |
| 0.677 | 0.075222222 | 0.805 |
| 1.381 | 0.153444444 | 0.755 |
| 2.253 | 0.250333333 | 0.705 |
| 3.226 | 0.358444444 | 0.655 |
| 4.315 | 0.479444444 | 0.606 |
| 5.439 | 0.604333333 | 0.556 |
| 6.612 | 0.734666667 | 0.506 |
| 8.188 | 0.909777778 | 0.44 |

TABLE III-continued

| Total Current (Amp) | Current Density (Amp/cm2) | Voltage (V) | |
|---|---|---|---|
| 9.362 | 1.040222222 | 0.406 | |
| 10.368 | 1.152 | 0.357 | |
| 11.223 | 1.247 | 0.307 | |
| 11.893 | 1.321444444 | 0.257 | |
| 12.447 | 1.383 | 0.207 | |
| 12.933 | 1.437 | 0.157 | |
| 12.799 | 1.422111111 | 0.157 | |
| 12.145 | 1.349444444 | 0.207 | |
| 11.441 | 1.271222222 | 0.257 | |
| 10.653 | 1.183666667 | 0.307 | |
| 9.831 | 1.092333333 | 0.357 | |
| 8.926 | 0.991777778 | 0.39 | |
| 7.97 | 0.885555556 | 0.44 | |
| 6.696 | 0.744 | 0.506 | |
| 5.673 | 0.630333333 | 0.556 | |
| 4.651 | 0.516777778 | 0.606 | |
| 3.628 | 0.403111111 | 0.655 | |
| 2.656 | 0.295111111 | 0.705 | |
| 1.717 | 0.190777778 | 0.755 | |
| 0.929 | 0.103222222 | 0.805 | |
| 0.359 | 0.039888889 | 0.855 | |
| 0.074 | 0.008222222 | 0.904 | |
| 0 | 0 | 0.954 | |
| Load Cell Area | | [9 cm^2] | |
| Anode Pressure | | [0] | |
| Anode Temperature | | [70 C.] | |
| Anode Gas Flow Rate | | [150 ml/min] | |
| Cathode Pressure | | [0 psig] | |
| Cathode Temperature | | [60 C.] | |
| Cathode Gas Flow Rate | | [1000 ml/min] | |
| Initial Voltage | | [.95 Volts] | |
| Voltage Increment | | [.05 Volts] | |
| Delay Between readings | | [5 sec] | |
| Anode Gas | | [HYDROGEN] | |
| Cathode Gas | | [Air] | |

TABLE IV

| Total Current (Amp) | Current Density (Amp/cm2) | Voltage (V) |
|---|---|---|
| 0 | 0 | 1.02 |
| 0.023 | 0.002555556 | 0.971 |
| 0.275 | 0.030555556 | 0.904 |
| 0.778 | 0.086444444 | 0.855 |
| 1.482 | 0.164666667 | 0.805 |
| 2.387 | 0.265222222 | 0.755 |
| 3.527 | 0.391888889 | 0.705 |
| 4.885 | 0.542777778 | 0.655 |
| 6.461 | 0.717888889 | 0.606 |
| 8.021 | 0.891222222 | 0.556 |
| 9.362 | 1.040222222 | 0.506 |
| 10.586 | 1.176222222 | 0.44 |
| 11.156 | 1.239555556 | 0.39 |
| 11.407 | 1.267444444 | 0.357 |
| 11.374 | 1.263777778 | 0.307 |
| 11.239 | 1.248777778 | 0.257 |
| 11.089 | 1.232111111 | 0.207 |
| 10.82 | 1.202222222 | 0.207 |
| 10.384 | 1.153777778 | 0.257 |
| 9.949 | 1.105444444 | 0.307 |
| 9.513 | 1.057 | 0.357 |
| 9.06 | 1.006666667 | 0.406 |
| 8.607 | 0.956333333 | 0.44 |
| 7.903 | 0.878111111 | 0.506 |
| 7.233 | 0.803666667 | 0.556 |
| 6.411 | 0.712333333 | 0.606 |
| 5.405 | 0.600555556 | 0.655 |
| 4.299 | 0.477666667 | 0.705 |
| 3.108 | 0.345333333 | 0.755 |
| 1.968 | 0.218666667 | 0.805 |
| 1.013 | 0.112555556 | 0.855 |
| 0.375 | 0.041666667 | 0.904 |
| 0.04 | 0.004444444 | 0.954 |

TABLE IV-continued

| Total Current (Amp) | Current Density (Amp/cm2) | Voltage (V) |
|---|---|---|
| 0 | 0 | 1 |
| Load Cell Area | | [9 cm^2] |
| Anode Pressure | | [0] |
| Anode Temperature | | [70 C.] |
| Anode Gas Flow Rate | | [150 ml/min] |
| Cathode Pressure | | [0 psig] |
| Cathode Temperature | | [60 C.] |
| Cathode Gas Flow Rate | | [1000 ml/min] |
| Initial Voltage | | [1 Volts] |
| Voltage Increment | | [.05 Volts] |
| Delay Between readings | | [5 sec] |
| Anode Gas | | [HYDROGEN] |
| Cathode Gas | | [Air] |

TABLE V

| Total Current (Amp) | Current Density (Amp/cm2) | Voltage (V) |
|---|---|---|
| 0.007 | 0.000777778 | 0.971 |
| 0.057 | 0.006333333 | 0.938 |
| 0.174 | 0.019333333 | 0.888 |
| 0.493 | 0.054777778 | 0.821 |
| 0.862 | 0.095777778 | 0.772 |
| 1.331 | 0.147888889 | 0.722 |
| 1.901 | 0.211222222 | 0.672 |
| 2.555 | 0.283888889 | 0.622 |
| 3.276 | 0.364 | 0.572 |
| 4.047 | 0.449666667 | 0.523 |
| 4.852 | 0.539111111 | 0.473 |
| 5.724 | 0.636 | 0.423 |
| 6.612 | 0.734666667 | 0.39 |
| 7.752 | 0.861333333 | 0.323 |
| 8.591 | 0.954555556 | 0.274 |
| 9.311 | 1.034555556 | 0.224 |
| 9.932 | 1.103555556 | 0.174 |
| 9.881 | 1.097888889 | 0.174 |
| 9.244 | 1.027111111 | 0.224 |
| 8.591 | 0.954555556 | 0.274 |
| 7.903 | 0.878111111 | 0.323 |
| 7.015 | 0.779444444 | 0.39 |
| 6.277 | 0.697444444 | 0.44 |
| 5.522 | 0.613555556 | 0.473 |
| 4.785 | 0.531666667 | 0.523 |
| 3.997 | 0.444111111 | 0.572 |
| 3.226 | 0.358444444 | 0.622 |
| 2.438 | 0.270888889 | 0.672 |
| 1.7 | 0.188888889 | 0.722 |
| 1.046 | 0.116222222 | 0.772 |
| 0.56 | 0.062222222 | 0.821 |
| 0.191 | 0.021222222 | 0.888 |
| 0.057 | 0.006333333 | 0.938 |
| 0 | 0 | 0.971 |
| Load Cell Area | | [9 cm^2] |
| Anode Pressure | | [0] |
| Anode Temperature | | [70 C.] |
| Anode Gas Flow Rate | | [150 ml/min] |
| Cathode Pressure | | [0 psig] |
| Cathode Temperature | | [60 C.] |
| Cathode Gas Flow Rate | | [1000 ml/min] |
| Initial Voltage | | [.97 Volts] |
| Voltage Increment | | [.05 Volts] |
| Delay Between readings | | [5 sec] |
| Anode Gas | | [HYDROGEN] |
| Cathode Gas | | [Air] |

What is claimed is:

1. An electrocatalytic structure article comprising: a film of a $SiO_xC_yH_z$ matrix having dispersed therein a catalytic amount of non-supported discrete particles of a catalytic material.

2. An electrode article comprising:

a. a layer of a solid polymer electrolyte material having a surface, b. a layer of the electrocatalytic structure of claim 1 in intimate contact with the surface of said solid polymeric electrolyte and defining a second surface, and c. an electroconductive backing layer in intimate contact with said electrocatalytic structure on the second surface opposite to the solid polymer electrolyte.

3. A gas reaction fuel cell article comprising, at least one anode and cathode electrode at least one of said electrodes comprising the electrode of claim 2.

4. A method of forming a dispersion of discrete particles of catalytic material in a $SiO_xC_yH_z$ matrix comprising:

(a). plasma polymerizing an organosilicone monomer onto the surface of a substrate to form a thin film of $SiO_xC_yH_z$ polymer, and (b). vacuum depositing a catalyst material as a layer of discrete particles onto the film of (a), and (c) repeating at least step (a) to form a second film of $SiO_xC_yH_z$ polymer over the discrete particles.

5. In an electrolytic cell article having an anode and catalytic particles in an anode compartment and a cathode and catalytic particles in an cathode compartment, the improvement comprising as the source of catalytic particles a thin film composed of a $SiO_xC_yH_z$ matrix having dispersed therein a catalytic quantity of non-supported discrete particles of a catalytic material.

6. The article of claims 1, 2, 3 or 5 wherein the discrete particles have an average particle size in the vertical direction of less than about 10 nm.

7. A fuel cell for generating electricity from a reaction between a fuel source and an oxidant source, the fuel cell comprising a first porous gas diffusion electrode, a second porous gas diffusion electrode, the second electrode defining an electric field with the first electrode, an electrocatalytic material in contact with said first electrode, an electrocatalytic material in contact with the second electrode and an electrolyte disposed between the first and second electrodes and in electronic contact with both catalyst materials, the improvement comprising: as the catalyst material, a thin film of $SiO_xC_yH_z$ matrix having dispersed therein a catalytic quantity of non-supported discrete particles of a catalytic material, said discrete particles having an average particle size in the vertical direction of less than about 10 nm.

* * * * *